(12) United States Patent
Nakazawa et al.

(10) Patent No.: US 8,890,210 B2
(45) Date of Patent: Nov. 18, 2014

(54) FIELD EFFECT TRANSISTOR

(71) Applicant: Panasonic Corporation, Osaka (JP)

(72) Inventors: Satoshi Nakazawa, Osaka (JP); Tetsuzo Ueda, Osaka (JP); Yoshiharu Anda, Osaka (JP); Naohiro Tsurumi, Toyama (JP); Ryo Kajitani, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/676,740

(22) Filed: Nov. 14, 2012

(65) Prior Publication Data

US 2013/0069115 A1    Mar. 21, 2013

Related U.S. Application Data

(63) Continuation of application No. PCT/JP2010/006935, filed on Nov. 29, 2010.

(30) Foreign Application Priority Data

May 25, 2010    (JP) ................................. 2010-119027

(51) Int. Cl.
| | |
|---|---|
| *H01L 29/78* | (2006.01) |
| *H01L 29/66* | (2006.01) |
| *H01L 29/778* | (2006.01) |
| *H01L 29/423* | (2006.01) |
| *H01L 29/417* | (2006.01) |
| *H01L 29/40* | (2006.01) |
| *H01L 29/47* | (2006.01) |
| *H01L 29/20* | (2006.01) |
| *H01L 29/08* | (2006.01) |

(52) U.S. Cl.
CPC ............... *H01L 29/78* (2013.01); *H01L 29/475* (2013.01); *H01L 29/66462* (2013.01); *H01L 29/2003* (2013.01); *H01L 29/7787* (2013.01); *H01L 29/42316* (2013.01); *H01L 29/41775* (2013.01); *H01L 29/402* (2013.01); *H01L 29/0891* (2013.01)

USPC ........... 257/192; 257/194; 257/206; 257/213; 257/350; 257/368; 257/390; 257/392; 257/401

(58) Field of Classification Search
CPC ........................... H01L 29/78; H01L 29/78618
USPC ......... 257/192, 194, 206, 205, 213, 262, 287, 257/348, 350, 368, 390, 391, 392, 393, 401
See application file for complete search history.

(56) References Cited

U.S. PATENT DOCUMENTS

2005/0062069 A1    3/2005    Saito et al.
2005/0274977 A1*   12/2005    Saito et al. .................... 257/192

(Continued)

FOREIGN PATENT DOCUMENTS

| JP | 2004-200248 A | 7/2004 |
|---|---|---|
| JP | 2006-222393 A | 8/2006 |

(Continued)

OTHER PUBLICATIONS

A.V. Vertiatchikh et al., "Effect of surface passivation of AlGaN/GaN heterostructure field-effect transistor", Electronics Letters, vol. 38, pp. 388-389 (2002).

(Continued)

*Primary Examiner* — Chuong A Luu
(74) *Attorney, Agent, or Firm* — McDermott Will & Emery LLP

(57) ABSTRACT

A field effect transistor includes a nitride semiconductor multilayer structure formed on a substrate, a source electrode, a drain electrode, a gate electrode, an insulating film formed on the nitride semiconductor multilayer structure, and a field plate formed on and in contact with the insulating film, and having an end located between the gate electrode and the drain electrode. The insulating film includes a first film, and a second film having a dielectric breakdown voltage lower than that of the first film, and a thin film portion formed between the gate electrode and the drain electrode is formed in the insulating film. The field plate covers the thin film portion, and is connected to the source electrode in an opening.

11 Claims, 7 Drawing Sheets

(56) References Cited

U.S. PATENT DOCUMENTS

| | | |
|---|---|---|
| 2006/0006415 A1 | 1/2006 | Wu et al. |
| 2006/0011915 A1* | 1/2006 | Saito et al. ................ 257/65 |
| 2006/0102929 A1 | 5/2006 | Okamoto et al. |
| 2009/0230430 A1 | 9/2009 | Miyamoto et al. |
| 2012/0126287 A1* | 5/2012 | Aoki ............................ 257/192 |

FOREIGN PATENT DOCUMENTS

| | | | |
|---|---|---|---|
| JP | 2006-222393 A | | 8/2006 |
| JP | 2007-048866 | * | 2/2007 |
| JP | 2007-048866 A | | 2/2007 |
| JP | 2007-048866 A | | 2/2007 |
| JP | 2007-537593 A | | 12/2007 |

OTHER PUBLICATIONS

International Search Report mailed Feb. 22, 2011 issued in corresponding International Application No. PCT/JP2010/006935.

* cited by examiner

FIELD EFFECT TRANSISTOR

CROSS-REFERENCE TO RELATED APPLICATION

This is a continuation of PCT International Application PCT/JP2010/006935 filed on Nov. 29, 2010, which claims priority to Japanese Patent Application No. 2010-119027 filed on May 25, 2010. The disclosures of these applications including the specifications, the drawings, and the claims are hereby incorporated by reference in their entirety.

BACKGROUND

The present disclosure relates to field effect transistors, and more particularly to field effect transistors made of nitride semiconductors.

A general formula of group III-V nitride semiconductors (e.g., gallium nitride (GaN) etc.) is expressed as $In_xAl_yGa_{1-x-y}N$ ($0 \leq x \leq 1$, $0 \leq y \leq 1$). The group III-V nitride semiconductors have wider band gaps, and for example, a band gap of GaN is 3.4 eV at room temperature. The group III-V nitride semiconductors have high breakdown field strength and high saturated electron velocity. Of the group III-V nitride semiconductors, in particular, in a nitride semiconductor having a heterostructure in which an AlGaN layer having a plane (0001) as a main surface is laminated on a GaN layer, electrons are accumulated at a high concentration near the heterojunction interface of the GaN layer due to strong polarization field to generate so-called two-dimensional electron gas. The two-dimensional electron gas is spatially separated from donor impurities added into the AlGaN layer, and thus, has high electron mobility. Furthermore, so-called saturated drift velocity is high in GaN materials. For example, in a high electric field region of about $1 \times 10^5$ V/cm, GaN materials have electron velocity twice or more as high as that of GaAs materials, which are now in the market as materials for high frequency transistors. The GaN materials have high band gaps and high breakdown field strength, and therefore, applications of such materials to high frequency and high output devices has been expected, and such applications have been actively researched and developed.

Trap levels (surface states) with a high density exist on a surface of the group III-V nitride semiconductors, and therefore, when the transistor is operated at a large signal level, the surface is negatively charged due to the response between electrons and the trap levels. When the surface is negatively charged, so-called current collapse occurs, where the drain current decreases and the parasitic resistance increases. When current collapse becomes more pronounced, the drain current decreases and the parasitic resistance increases at a time of driving the transistor by a high voltage, resulting in limiting the power. In order to reduce current collapse, it is important to reduce surface states, and it has been considered that field effect transistors made of group III-V nitride semiconductors include silicon nitride (SiN) as an interlayer film or a surface passivation film to reduce surface states (for example, see A. V. Vertiatchikh, L. F. Eastman, W. J. Schaff and T. Prunty, "Effect of surface passivation of AlGaN/GaN heterostructure field-effect transistor", Electronics Letters, Vol. 38, 388-389 (2002)). However, even if a SiN film is used as an interlayer film etc., current collapse cannot be completely prevented. Moreover, the formation of an interlayer film made of an SiN film causes problems, e.g., a decrease in the breakdown voltage, an increase in the gate leakage current in a gate electrode. In a field which requires a high output power operation, it is necessary to achieve not only large current control and high breakdown voltage, and therefore, a decrease in the breakdown voltage is a serious problem.

In order to improve breakdown voltages of field effect transistors, it has been considered to provide a gate electrode with a field plate protruding toward a drain electrode (for example, see Japanese Patent Publication No. 2004-200248). The field plate is provided in the gate electrode, whereby it is expected to reduce the concentration of an electric field near the gate electrode, and improve the breakdown voltage. However, when the field plate is provided in the gate electrode, the feedback capacitance increases due to the parasitic capacitance directly under the field plate, and the gain is further reduced than that in a gate electrode having no field plate.

In order to prevent reducing the gain due to a field plate, it has been considered to electrically connect a field plate formed between a gate electrode and a drain electrode to a source electrode (for example, see Japanese Translation of PCT International Application No. 2007-537593). The field plate formed between the gate electrode and the drain electrode is electrically connected to the source electrode, whereby it is expected to be able to reduce the concentration of an electric field near the gate electrode, and decrease the parasitic capacitance ($C_{gd}$) occurring between the gate and the drain. With such a configuration, reduced current collapse, improved gate breakdown voltage, and improved gain are expected.

SUMMARY

However, the present inventors have found that only an electrical connection of a field plate to a source electrode cannot sufficiently decrease the parasitic capacitance, sufficiently reduce current collapse, and improve the gain.

It is an object of the present disclosure to solve the problem found by the present inventors where the parasitic capacitance cannot sufficiently decrease, and provide a field effect transistor exhibiting small current collapse, and having excellent high-frequency characteristics.

In order to attain the above object, a field effect transistor according to the present disclosure has a structure in which a field plate is formed on an insulating film in which a first film and a second film having a dielectric breakdown voltage lower than that of the first film are laminated, and is connected to a source electrode.

Specifically, a field effect transistor of the present disclosure includes: a nitride semiconductor multilayer structure formed on a substrate and including a heterojunction; a source electrode and a drain electrode formed on the nitride semiconductor multilayer structure; a gate electrode formed between the source electrode and the drain electrode; an insulating film formed on the nitride semiconductor multilayer structure to cover the gate electrode; and a field plate formed on and in contact with the insulating film, and having an end located between the gate electrode and the drain electrode, wherein the insulating film includes a first film, and a second film formed on the first film and having a dielectric breakdown voltage lower than that of the first film, and an opening exposing the source electrode, and a thin film portion which is formed between the gate electrode and the drain electrode and in which at least part of the second film is removed are formed in the insulating film, and the field plate covers the thin film portion, and is connected to the source electrode in the opening.

The field effect transistor of the present disclosure includes the field plate formed on and in contact with the insulating film, where the insulating film includes the first film, and the second film formed on the first film and having a dielectric breakdown voltage lower than that of the first film the first film. Therefore, at least part of the second film is removed in a space between the gate electrode and the drain electrode, thereby easily forming the thin film portion. Therefore, a distance between the upper surface of the nitride semiconductor multilayer structure and the lower surface of the field plate can be easily shorter, and a distance between the field plate and the gate electrode, a distance between the field plate and the drain electrode can be easily ensured. Moreover, since the first film has a higher dielectric breakdown voltage, sufficient insulation properties can be easily ensured.

The field effect transistor of the present disclosure may have a structure in which the second film has a thickness thicker than that of the first film.

The field effect transistor of the present disclosure may have a structure in which the thin film portion has a thickness thinner than that of a portion of the insulating film located between the thin film portion and the drain electrode, and that of a portion of the insulating film located between the thin film portion and the gate electrode.

With such a structure, the distance between the field plate and the gate electrode and the distance between the field plate and the drain electrode can be easily maintained while the distance between the upper surface of the nitride semiconductor multilayer structure and the lower surface of the field plate is shorter.

In the field effect transistor of the present disclosure, the thin film portion may be a recessed portion in which at least part of the second film is removed, and the recessed portion is filled with the field plate.

In the field effect transistor of the present disclosure, part of the second film may remain on a bottom surface of the recessed portion.

In the field effect transistor of the present disclosure, the end of the field plate may be located closer to the drain electrode than the thin film portion is. With such a location, the end of the field plate can be located closer to the drain electrode while the wider distance between the field plate and the drain electrode is ensured.

In the field effect transistor of the present disclosure, the first film may be an insulating film including aluminum.

In the field effect transistor of the present disclosure, the first film may have a thickness of 50 nm or less.

In the field effect transistor of the present disclosure, a length from the gate electrode to the end of the field plate may be 40% or more and 80% or less of a length from the gate electrode to the drain electrode.

In the field effect transistor of the present disclosure, the insulating film may include a third film formed between the first film and the second film, and having a dielectric breakdown voltage lower than that of the first film.

The present disclosure can achieve a field effect transistor exhibiting small current collapse and having excellent high-frequency characteristics.

DETAILED DESCRIPTION

Figure 1:
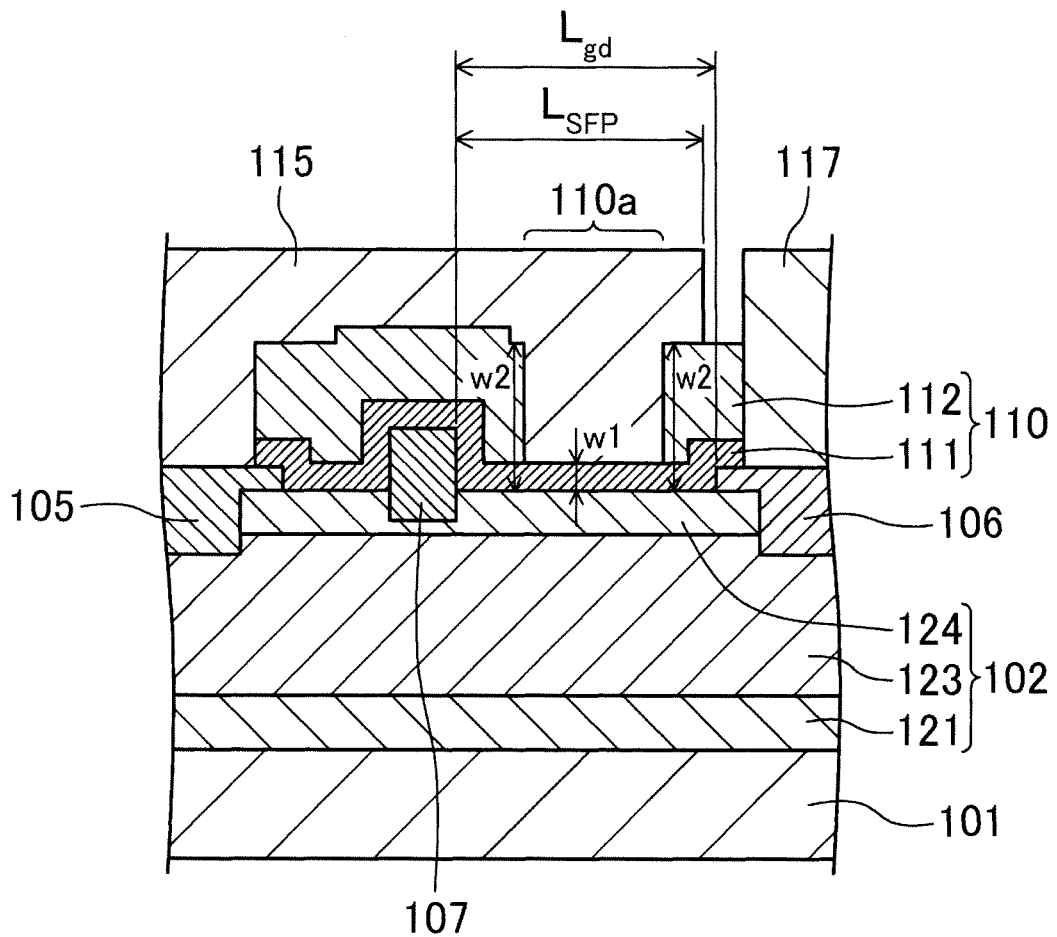
FIG. 1 is a cross-sectional view of a field effect transistor according to an embodiment.

FIG. 1 is a cross-sectional structure of a field effect transistor according to an embodiment. The field effect transistor of the embodiment includes a nitride semiconductor multilayer structure 102 formed on a substrate 101, and a source electrode 105, a drain electrode 106, and a gate electrode 107 formed on the nitride semiconductor multilayer structure 102. The substrate 101 may be a silicon (Si) substrate etc. The nitride semiconductor multilayer structure 102 has a buffer layer 121, an underlying layer 123, and an electron supply layer 124 which are sequentially formed on the substrate 101. A channel made of two-dimensional electron gas is formed near an interface of the underlying layer 123 with the electron supply layer 124. The buffer layer 121 may be made of undoped aluminum nitride having a thickness of approximately 200 nm. The underlying layer 123 may be made of undoped GaN having a thickness of approximately 1 μm. The electron supply layer 124 may be made of undoped $Al_{0.25}Ga_{0.75}N$ having a thickness of approximately 25 nm. The nitride semiconductor multilayer structure 102 may be formed by a metal organic chemical vapor deposition (MOCVD) method etc.

The source electrode 105 and the drain electrode 106 form an ohmic contact with the channel, and may be an alloy of, e.g., titanium (Ti) and aluminum (Al). In this embodiment, the source electrode 105 and the drain electrode 106 are formed to fill an ohmic recess, a part of which is below the interface between the electron supply layer 124 and the underlying layer 123, and are directly in contact with the channel. The gate electrode 107 forms a Schottky contact with the channel, and may be, for example, a multilayer structure of nickel (Ni) and gold (Au). In this embodiment, the gate electrode 107 is formed in a gate recess to adjust a threshold voltage.

Figure 2:
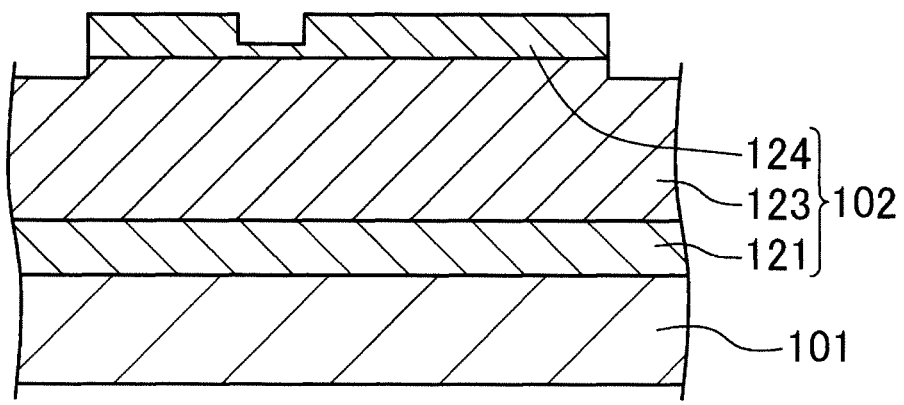
FIG. 2 is a cross-sectional view illustrating a step of a method of fabricating the field effect transistor according to the embodiment.

The gate recess and the ohmic recess may be formed, as shown in FIG. 2. A mask is formed by photoresist after the nitride semiconductor multilayer structure 102 having the buffer layer 121, the underlying layer 123, and the electron supply layer 124 is formed on the substrate 101, and thereafter, part of the electron supply layer 124 is selectively removed by induced coupled plasma (ICP) etching using chlorine ($Cl_2$) gas to form a gate recess. Subsequently, after a new mask is formed by photoresist, part of the electron supply layer 124 and the underlying layer 123 is selectively removed by ICP etching $Cl_2$ gas to form an ohmic recess. A gate recess may be formed in a striped shape having a thickness of approximately 0.5 μm.

Figure 3:
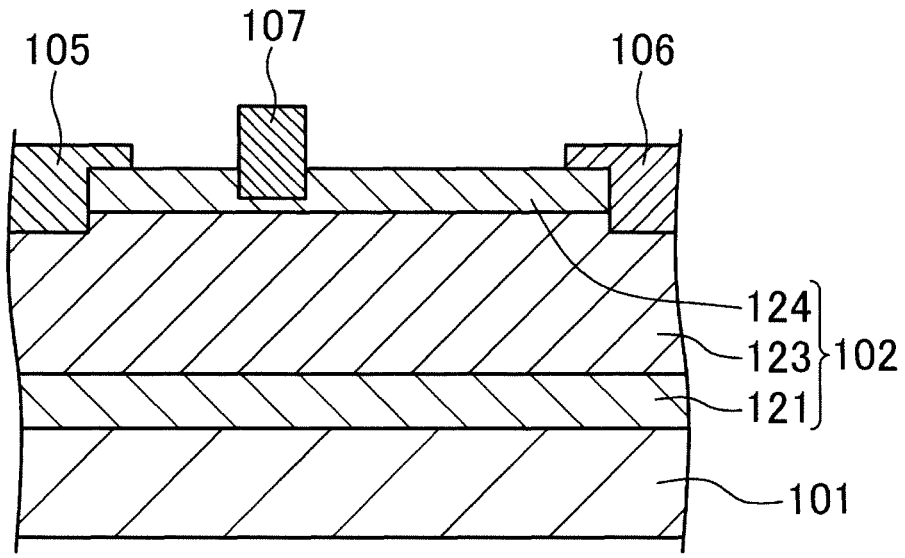
FIG. 3 is a cross-sectional view illustrating a step of the method of fabricating the field effect transistor according to the embodiment.

The ohmic recess and the gate recess may be filled with an electrode metal by electron beam deposition and lift-off, as shown in FIG. 3. After the source electrode 105 and the drain electrode 106 are formed, a heat treatment at a temperature of approximately 600° C. may be performed under in a nitride atmosphere in order to reduce contact resistance.

Figure 4:
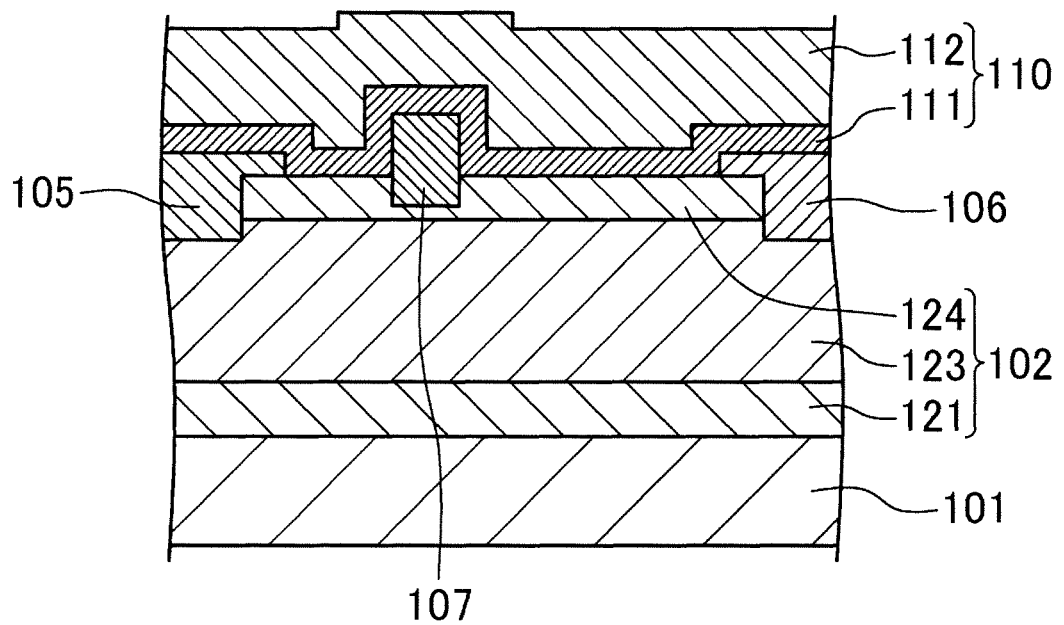
FIG. 4 is a cross-sectional view illustrating a step of the method of fabricating the field effect transistor according to the embodiment.

An insulating film 110 is formed on the nitride semiconductor multilayer structure 102 to cover the source electrode 105, the drain electrode 106, and the gate electrode 107. The insulating film 110 includes a first film 111 made of aluminum nitride (AlN), and a second film 112 formed on the first film 111 and made of silicon nitride. In the insulating film 110, a thin film portion 110a formed between the gate electrode 107 and the drain electrode 106, and an opening exposing part of the source electrode 105 and an opening exposing part of the drain electrode 106 are formed. A thickness w1 of the insulating film 110 in the thin film portion 110a is less than a thickness w2 of the insulating film 110 in a portion closer to the drain electrode 106 than the thin film portion 110a is. The thickness w1 of the insulating film 110 in the thin film portion 110a is less than a thickness w2 of the insulating film 110 in a portion closer to the gate electrode 107 than the thin film portion 110a is. In this embodiment, the thin film portion 110a is a recessed portion in which the second film 112 is removed and the first film 111 is exposed. The first film 111 may have a thickness of approximately 50 nm, and the second film 112 may have a thickness of approximately 500 nm. As shown in FIG. 4, the first film 111 made of AlN may be formed by a direct current (DC) sputtering method, and the second film 112 made of SiN may be formed by a plasma-assisted chemical vapor deposition (PCVD) method.

Figure 5:
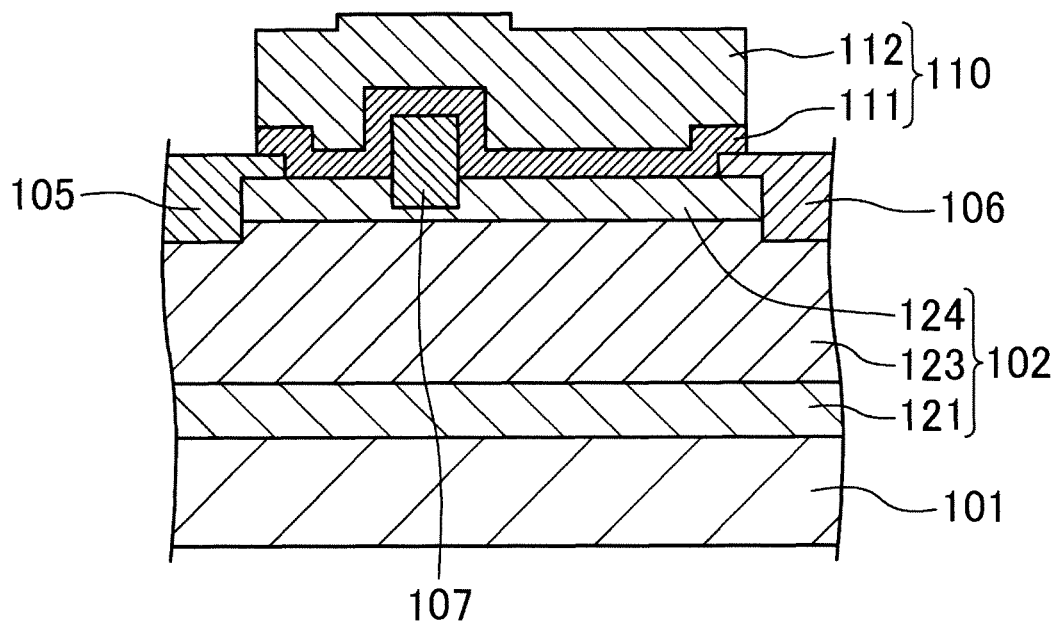
FIG. 5 is a cross-sectional view illustrating a step of the method of fabricating the field effect transistor according to the embodiment.
Figure 6:
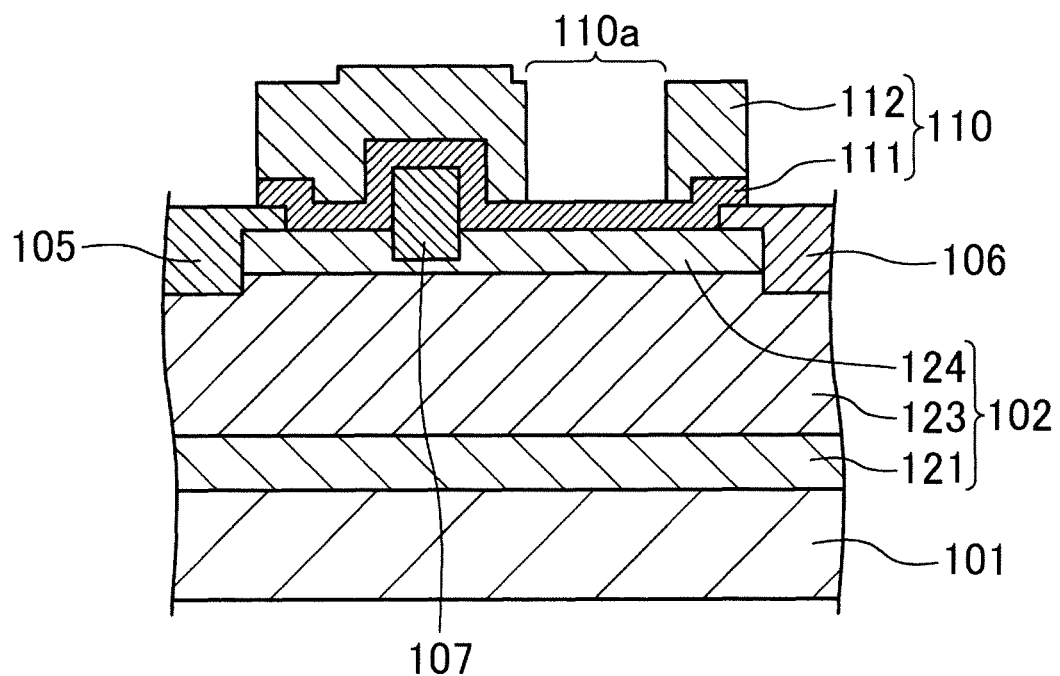
FIG. 6 is a cross-sectional view illustrating a step of the method of fabricating the field effect transistor according to the embodiment.

The opening exposing the part of the source electrode 105 and the opening exposing the part of the drain electrode 106 may be formed, as shown in FIG. 5, by selectively removing the second film 112 by reactive ion etching (RIE) using mixed gas of tetrafluoromethane ($CF_4$) and methane trifluoride ($CHF_3$), and subsequently, by selectively removing the first film 111 by ICP etching using Cl, gas. The thin film portion 110a in which the first film 111 is left intact may be formed, as shown in FIG. 6, by selectively removing the second film 112 by reactive ion etching (RIE) using mixed gas of $CF_4$ and $CHF_3$.

A field plate 115 is formed on the insulating film 110 to contact the insulating film 110. The field plate 115 is made of a conductive material, such as gold (Au) etc. The field plate 115 may be formed by a plating method. The field plate 115 is connected to the source electrode 105 in the opening formed in the insulating film 110 and exposing the part of the source electrode 105. An end of the field plate 115 closer to the drain electrode 106 is located closer to the drain electrode 106 than the gate electrode 107 is, and closer to the gate electrode 107 than the drain electrode 106 is. In this embodiment, the field plate 115 is formed to fill the recessed portion in which the second film 112 is removed, and the end of the field plate 115 is located closer to the drain electrode 106 than the thin film portion 110a is.

The field plate 115 is part of an interconnect applying a voltage to the source electrode 105. An interconnect 117 applying a voltage to the drain electrode 106 is formed in the opening formed in the insulating film 110 and exposing the part of the drain electrode 106.

A principle that the field effect transistor of this embodiment can reduce current collapse and improve high-frequency characteristics will be described hereinafter. In a device in which current collapse occurs, values of a drain current and an on-state resistance (a parasitic resistance when the device is in the on state) when a DC voltage is applied as a bias voltage, and values of a drain current and an on-state resistance when a pulse voltage is applied as a bias voltage are different from each other. Carriers have been trapped in surface states for a long time in the off state. Therefore, if the transistor suddenly changes from the off state to the on state by the pulse voltage, the carriers which have been trapped in the surface states in the off state remains, not released. By the carriers which have been trapped in surface states, the channel maintains depleted, and therefore, current collapse occurs, which increases the on-state resistance.

Figure 7:
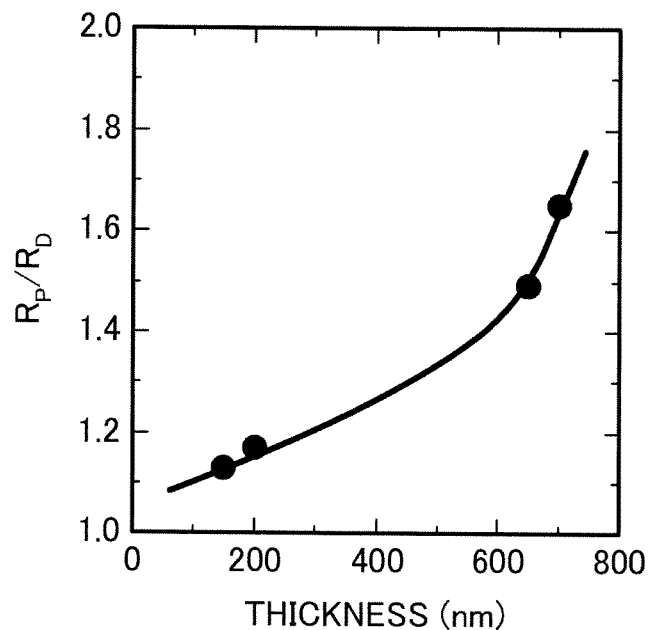
FIG. 7 is a graph illustrating a relationship between a thickness of an insulating film and a degree of current collapse.

FIG. 7 illustrates a distance between the surface of the field plate 115 and the surface of the nitride semiconductor multilayer structure 102, in other words, a relationship between the thickness w1 of the insulating film 110 in the thin film portion 110a and a degree of the current collapse. The degree of the current collapse is shown by a ratio of $R_P/R_D$ where $R_P$ is an on-state resistance when a pulse voltage is applied as a bias voltage to the gate electrode 107, and $R_D$ is an on-state resistance when a DC voltage is applied as a bias voltage to the gate electrode 107. The on-state resistance $R_P$ when the pulse voltage is applied is an on-state resistance immediately after a transition from a bias point at which a transistor having a gate voltage of −5 V and a drain voltage of 60 V is in the off state to a bias point at which the transistor is in the on state under condition of a pulse width of 0.5μ second and a pulse interval of 1 millisecond.

As shown in FIG. 7, when the insulating film has a thickness of approximately 600 nm, the ratio $R_P/R_D$ of the on-state resistance is approximately 1.5. This means that the collapse increases the on-state resistance by about 50%, and the collapse cannot be sufficiently reduced by the field plate. In contrast, if the thickness of the insulating film is thinner to make a distance between the lower surface of the field plate and the surface of the semiconductor multilayer structure shorter, the ratio $R_P/R_D$ of the on-state resistance becomes smaller, which improves the advantage of reducing current collapse. In this way, in order to efficiently reduce current collapse by using the field plate, it is necessary to make the insulating film thinner, and make the distance between the lower surface of the field plate and the surface of the semiconductor multilayer structure the field plate shorter.

Figure 8:
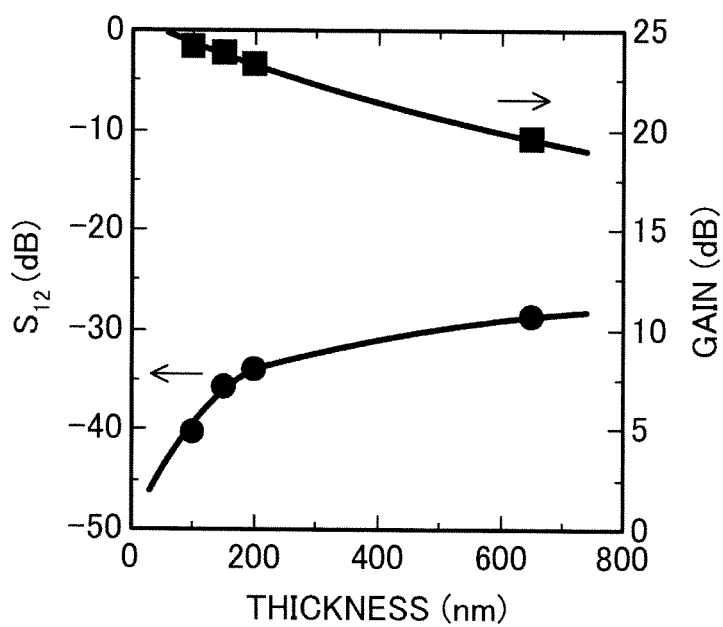
FIG. 8 is a graph illustrating a relationship between the thickness of the insulating film and high-frequency characteristics.
Figure 9:
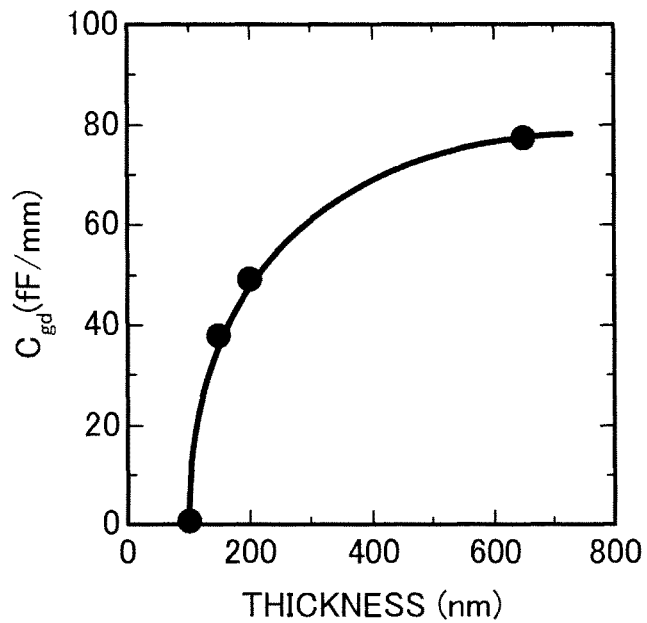
FIG. 9 is a graph illustrating a relationship between the thickness of the insulating film and a parasitic capacitance.

Next, variations of the high-frequency characteristics by the field plate will be described. FIG. 8 illustrates a relationship among the thickness of the insulating film, insertion loss (S12) between an input and an output which is an index of the high-frequency characteristics, and the gain. As shown in FIG. 8, when the insulating film has a thinner thickness and the distance between the lower surface of the field plate and the surface of the semiconductor multilayer structure is made shorter, S12 becomes smaller, and the gain becomes larger. In this way, the shorter distance between the lower surface of the field plate and the surface of the semiconductor multilayer structure improves the high-frequency characteristics since the value of the parasitic capacitance $C_{gd}$ between the gate and the drain can be smaller. As shown in FIG. 9, the parasitic capacitance $C_{gd}$ becomes smaller when the insulating film has a thicker thickness, and in particular, the parasitic capacitance $C_{gd}$ becomes drastically smaller when the insulating film has a thickness of approximately 200 nm or less.

Figure 10:
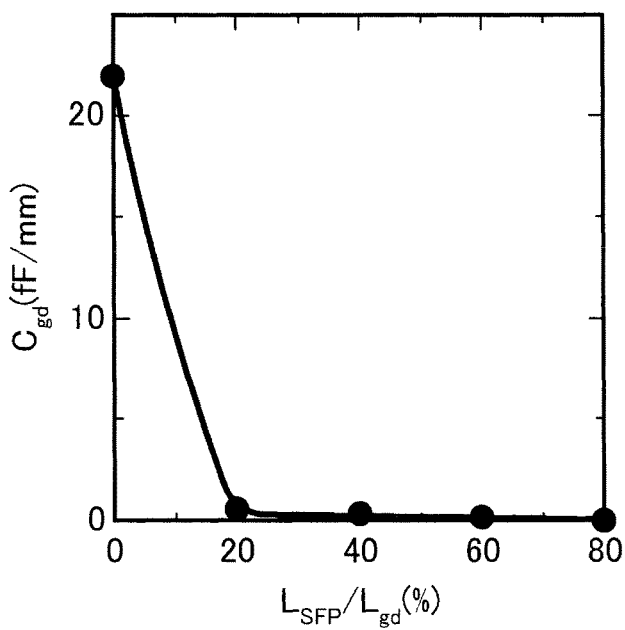
FIG. 10 is a graph illustrating a relationship between a length of a field plate and the parasitic capacitance.
Figure 11:
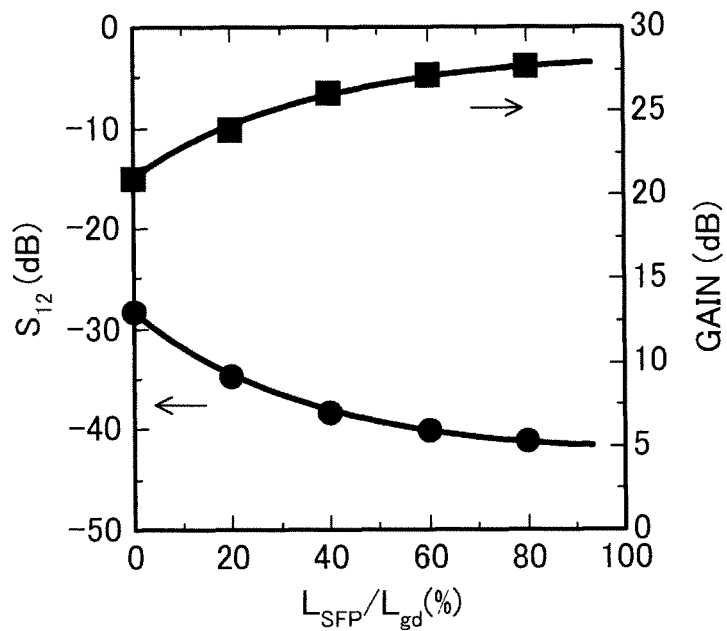
FIG. 11 is a graph illustrating a relationship between the length of the field plate and high-frequency characteristics.

The value of the parasitic capacitance $C_{gd}$ may varies not only by the thickness of the insulating film in the thin film portion but also by the length of the field plate. FIG. 10 illustrates a relationship between a ratio $L_{SFP}/L_{gd}$ and the parasitic capacitance $C_{gd}$, where a distance $L_{SFP}$ refers to a distance from the gate electrode to an end of the field plate closer to the drain electrode, and a distance $L_{gd}$ refers to a distance from the gate electrode to the drain electrode. As shown in FIG. 10, the ratio $L_{SFP}/L_{gd}$ is 20% or more, thereby making it possible to make the parasitic capacitance $C_{gd}$ smaller. It is expected that the smaller parasitic capacitance $C_{gd}$ would improve the high-frequency characteristics. FIG. 11 illustrates a relationship among the ratio $L_{SFP}/L_{gd}$, S12, and the gain. It is clear that the larger the ratio $L_{SFP}/L_{gd}$ is, the smaller S12 is.

As described above, in order to reduce current collapse and improve high-frequency characteristics by the field plate connected to the source electrode, it is efficient to make the insulating film formed between the field plate and the semiconductor multilayer structure as thin as possible, and make the field plate as long as possible. However, since the same voltage as that applied to the source electrode is applied to the field plate, it is impossible to simply reduce the thickness of the insulating film to ensure the breakdown voltage between the field plate and the semiconductor multilayer structure, and the breakdown voltage between the field plate and the gate electrode. If the length of the field plate is longer, the field plate and the drain electrode are close to each other, resulting in decrease in the breakdown voltage. In a conventional field effect transistor, since the drain electrode and the field plate are formed on the substantially same plane, increasing the length of the field plate is subjected to limitations on the process.

However, the field effect transistor of this embodiment includes the insulating film 110 having a multilayer structure of the first film 111 made of AlN, and the second film 112 made of SiN. Therefore, it is easily possible to selectively remove the second film 112 while leaving the first film 111. Therefore, the thin film portion 110a having a thinner thickness of the insulating film 110 can be easily formed between the gate electrode 107 and the drain electrode 106. Since the dielectric breakdown voltage of AlN is about 1.5 times to 2 times larger than that of SiN, it is possible to ensure a sufficient breakdown voltage even in a portion of the insulating film 110 having a thinner thickness. Moreover, the thickness of a portion of the insulating film 110 is made thicker near the drain electrode, thereby easily ensuring a wider distance between the field plate 115 and the drain electrode 106 in the vertical direction, even if the distance therebetween in the horizontal direction is made shorter. Therefore, it is easily possible to make the length of field plate 115 longer while ensuring the breakdown voltage.

Figure 12:
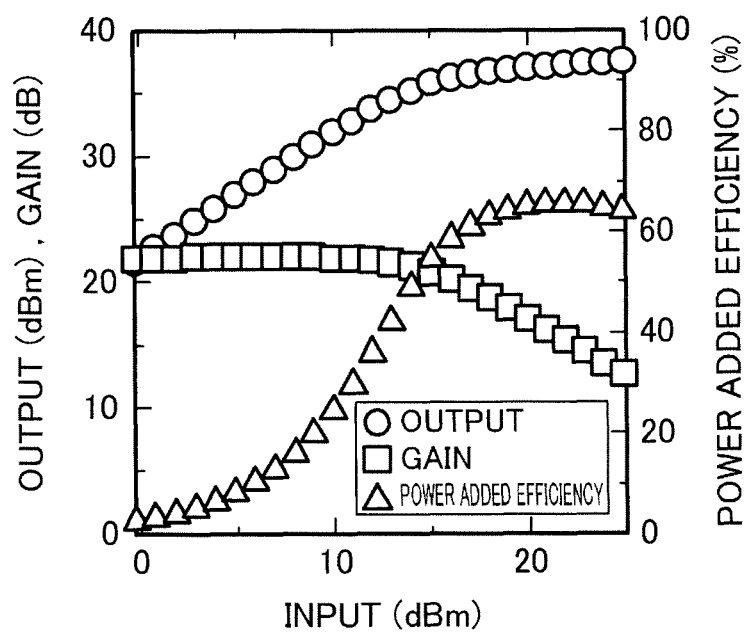
FIG. 12 is a graph illustrating input/output characteristics of the field effect transistor according to the embodiment.

FIG. 12 illustrates typical input/output characteristics in the field effect transistor of this embodiment. In FIG. 12, the thickness w1 of the insulating film 110 in the thin film portion 110a is 50 nm, and the ratio $L_{SFP}/L_{gd}$ is 80%. The parasitic capacitance decreases and the gain increases, thereby obtaining excellent input/output characteristics with high reliability.

It is preferable that the thickness of the insulating film 110 in the thin film portion 110a be made as thin as possible. Therefore, the thickness is preferably 50 nm or less, and is more preferably 10 nm or less. Furthermore, the thickness may be still thinner, and it is preferable to ensure the thickness of approximately 5 nm. It is preferable that the thickness of the portion of the insulating film 110 other than that of the insulating film 110 in the thin film portion 110a be made as thick as possible to ensure the breakdown voltage. Therefore, the thickness is preferably 200 nm or more, and more preferably 500 nm. If the thickness is too thick, the process becomes difficult, and the thickness is preferably about 2 µm or less.

The length of the field plate 115 is set so that the ratio $L_{SFP}/L_{gd}$ is preferably 20% or more, and is more preferably 60% or more. If the ratio $L_{SFP}/L_{gd}$ is too large, the distance between the field plate 115 and the drain electrode 106 may not be ensured. If the ratio $L_{SFP}/L_{gd}$ is approximately 80% or less, the field plate 115 can be formed by the general process. When the ratio $L_{SFP}/L_{gd}$ is constant, as a ratio of a portion formed on the thin film portion 110a to the distance $L_{SFP}$ becomes larger, the advantages of reducing collapse and improving high-frequency characteristics become more considerable. The advantages of reducing collapse and improving high-frequency characteristics can be sufficiently obtained as long as the ratio of the portion formed on the thin film portion 110a to the distance $L_{SFP}$ is approximately 20% or more. Moreover, in this embodiment, the field plate 115 is also formed on a portion of the insulating film 110 located closer to the drain electrode 106 than the thin film portion 110a is and having a thicker thickness than that of the thin film portion 110a. It is unnecessary to from the field plate 115 on the portion of the insulating film 110 located closer to the drain electrode 106 than the thin film portion 110a is and having a thicker thickness than that of the thin film portion 110a as long as the sufficient value of the $L_{SFP}/L_{gd}$ can be ensured.

This embodiment allows increased thickness of the insulating film 110 between the source electrode 105 and the gate electrode 107. Therefore, even if the width of the field plate 115 in the gate width is wider to completely cover the space between the source electrode 105 and the gate electrode 107, there is almost no possibility of a decrease in the breakdown voltage between the gate and the source, and an increase in the parasitic resistance between the gate and the source. However, the field plate 115 does not have to completely cover the space between the source electrode 105 and the gate electrode 107. The width of the field plate 115 on the space between the source electrode 105 and the gate electrode 107 in the gate width direction may be narrower than the gate width as long as a conduction between the source electrode 105 and the field plate 115 can be ensured.

Figure 13:
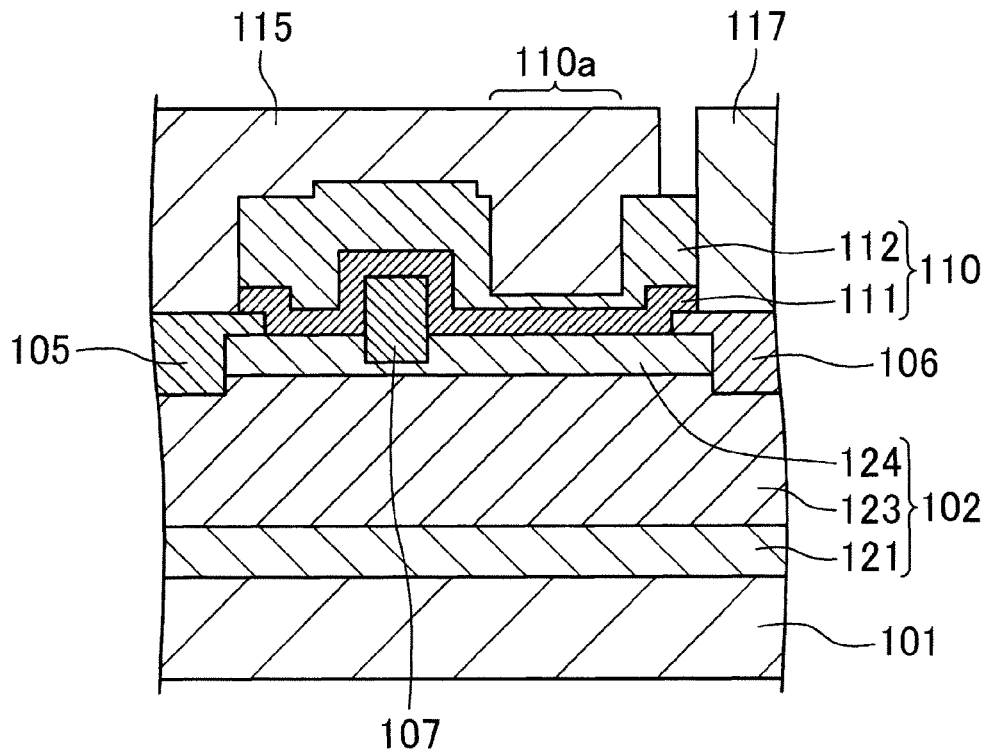
FIG. 13 is a cross-sectional view of a modified example of the field effect transistor according to the embodiment.
Figure 14:
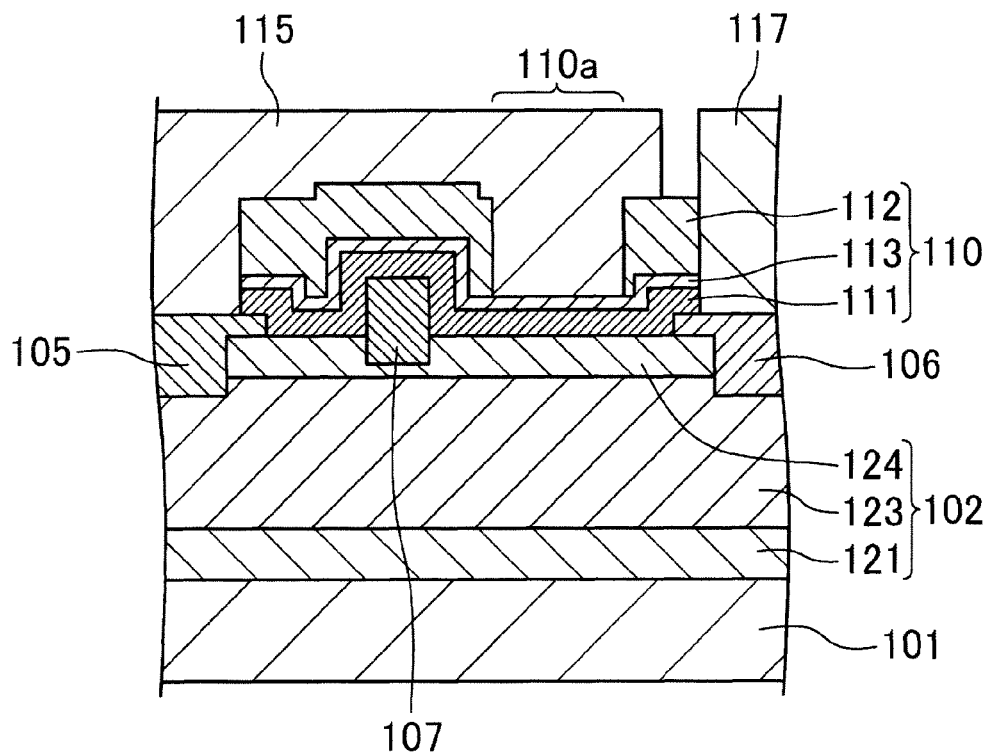
FIG. 14 is a cross-sectional view of a modified example of the field effect transistor according to the embodiment.

This embodiment has been described as completely removing the second film 112 in the thin film portion 110a while only leaving the first film 111. However, as shown in FIG. 13, part of the second film 112 may be left in the thin film portion 110a. As shown in FIG. 14, a third film 113 may be formed between the first film 111 and the second film 112. Furthermore, the third insulating film 113 may be removed in the thin film portion 110a.

While the first film 111 is the AlN film, the first film 111 may be an insulating film having a high dielectric breakdown voltage, and can be another insulating film including Al, such as aluminum oxide ($Al_2O_3$) etc., instead of the AlN film. The second film 112 may be an insulating film having etching selectivity with respect to the first film 111, and it is preferable to use a film having a low dielectric constant. When the third film 113 is formed between the first film 111 and the second film 112, the third film 113 may have etching selectivity with respect to the first film. If the third film 113 has a dielectric constant higher than that of the second film 112, the advantages of the field plate 115 can be improved.

While the substrate 101 is the Si substrate in this embodiment, the substrate 101 may be a hetero-substrate, such as a silicon carbide (SiC) substrate, a sapphire substrate, a zinc oxide (ZnO) substrate, a zirconium boride (ZrB)) substrate, etc., or a group III-V nitride semiconductor substrate, such as a GaN substrate, an AlN substrate, etc. In the nitride semiconductor multilayer structure, the composition ratio of the respective layers may be changed as long as desired device characteristics are achieved. The layered structure of the nitride semiconductor multilayer structure may be changed. The crystal growth method of the nitride semiconductor multilayer structure may be, e.g., a molecular beam epitaxy (MBE) method, a hydride vapor phase epitaxy (HVPE) method, etc., instead of a MOCVD method. Moreover, the semiconductor layer may be a semiconductor layer including, e.g., arsenic (As), phosphorus (P), etc., as a V group element, or a semiconductor layer including, e.g., boron (B) as a III group element. In addition to the field effect transistor made of the group III-V nitride semiconductor, a field effect transistor made of a GaAs semiconductor or a field effect transistor made of an InP semiconductor having a structure similar to that of the field effect transistor made of the group III-V nitride semiconductor can achieve the similar advantages.

The embodiments of the present disclosure provide field effect transistors exhibiting small current collapse and having excellent high-frequency characteristics, and in particular, the field effect transistors of the present disclosure are useful as a high frequency device used for application of milliwave communication etc., and as a device used for switching regulators, inverter circuits, motor drive circuits, etc.

What is claimed is:

1. A field effect transistor, comprising:
   a nitride semiconductor multilayer structure formed on an upper surface of a substrate and including a heterojunction;
   a source electrode and a drain electrode formed on the nitride semiconductor multilayer structure;
   a gate electrode formed between the source electrode and the drain electrode;
   an insulating film formed on the nitride semiconductor multilayer structure; and
   a field plate formed on and in contact with an upper surface of the insulating film, and having an end located between the gate electrode and the drain electrode,
   wherein
   the insulating film includes a first film and a second film sequentially formed on the nitride semiconductor multilayer structure,
   an opening exposing the source electrode is formed in the insulating film, and a thin film portion which is formed between the gate electrode and the drain electrode and in which at least part of the second film is removed so as to form a recess in an upper surface of the insulating film, the thin film portion having an upper surface which is closer to the upper surface of the substrate than an upper surface of the second film outside the thin film portion, the insulating film having a thickness in the thin film portion which is less than a thickness of the insulating film outside the thin film portion,
   the first film covers an upper surface of the gate electrode,
   the second film is formed on an upper surface of the first film and has a dielectric breakdown voltage lower than that of the first film, and
   the field plate covers the thin film portion, and is connected to the source electrode in the opening.

2. The field effect transistor of claim 1, wherein the second film has a thickness thicker than that of the first film.

3. The field effect transistor of claim 2, wherein the thin film portion has a thickness thinner than that of a portion of the insulating film located between the thin film portion and the drain electrode, and that of a portion of the insulating film located between the thin film portion and the gate electrode.

4. The field effect transistor of claim 3, wherein
   the thin film portion is a recessed portion in which at least part of the second film is removed, and
   the recessed portion is filled with the field plate.

5. The field effect transistor of claim 4, wherein part of the second film remains on a bottom surface of the recessed portion.

6. The field effect transistor of claim 3, wherein the end of the field plate is located closer to the drain electrode than the thin film portion is.

7. The field effect transistor of claim 1, wherein the first film includes aluminum.

8. The field effect transistor of claim 7, wherein the first lm has a thickness of 50 nm or less.

9. The field effect transistor of claim 1, wherein a length from the gate electrode to the end of the field plate is 40% or more and 80% or less of a length from the gate electrode to the drain electrode.

10. The field effect transistor of claim 1, wherein the insulating film includes a third film formed between the first film and the second film, and having a dielectric breakdown voltage lower than that of the first film.

11. The field effect transistor of claim 1, wherein:
    the insulating film has a first portion between the thin portion and the gate electrode, and a second portion between the thin portion and the drain electrode,
    a distance between an upper surface of the nitride semiconductor multilayer structure and an upper surface of the second portion is greater than a distance between an upper surface of the nitride semiconductor multilayer structure and an upper surface of the thin portion, and
    the field plate covers the upper surface of the thin portion and the upper surface of the second portion.

* * * * *